United States Patent [19]

Stoner

[11] 3,823,350

[45] July 9, 1974

[54] PROTECTIVE CARRIER FOR SEMICONDUCTOR CHIPS

[75] Inventor: Charles L. Stoner, Albuquerque, N. Mex.

[73] Assignee: The United States of America as represented by the United States Atomic Energy Commission, Washington, D.C.

[22] Filed: Sept. 5, 1973

[21] Appl. No.: 394,585

[52] U.S. Cl. .......... 317/234 R, 174/50.52, 174/52 S, 317/234 E, 317/234 G, 317/101, 339/174

[51] Int. Cl. .......... H01l 3/00, H01l 5/00

[58] Field of Search .......... 317/234, 3, 3.1, 4, 4.1, 317/1, 100, 101; 339/174; 29/453; 174/50.52, 52 PE; 264/272

[56] References Cited

UNITED STATES PATENTS

| | | | |
|---|---|---|---|
| 3,192,307 | 6/1965 | Lazar | 317/234 E |
| 3,409,861 | 11/1968 | Barnes et al. | 317/234 G |
| 3,539,875 | 11/1970 | Fong et al. | 317/234 G |
| 3,575,546 | 4/1971 | Liautaud | 317/234 H |
| 3,786,317 | 1/1974 | Thierfelder | 317/234 R |

*Primary Examiner*—Andrew J. James
*Attorney, Agent, or Firm*—John A. Horan; Dudley W. King; Ignaceo Resendez

[57] ABSTRACT

A protective carrier for microcircuit devices, e.g., semiconductor chips, having beam leads is described, wherein a cover retains the chip such that its beam leads are in electrical contact with electrically conductive leads of a base so that the chips may be readily handles and tested while so retained.

4 Claims, 5 Drawing Figures

PROTECTIVE CARRIER FOR SEMICONDUCTOR CHIPS

BACKGROUND OF INVENTION

The invention relates to a novel apparatus for carrying such as semiconductor beam lead chips.

Integrated or the like circuits or portions of circuits are often formed on a semiconductor chip. Such chips having metal strips or beams (i.e., - beam leads) forming electrically conductive paths on the chips permit their joining to a circuit component by positioning the chip with a desired orientation on the circuit component such that the beam leads contact electrically conductive paths on the circuit component. The beam leads may then be, as is known in the art, pressure bonded to the conductive paths by applying heat and pressure to the beam lead only and not the chip material.

A plurality of semiconductor beam lead chips may be formed on a common semiconductor wafer; each chip being of sufficient size to accommodate desired circuitry and, in general, may be about 0.017 inch square in size with beam leads extending therefrom. After forming, the chips may be removed or separated from the wafer and are commonly mounted on a carrier plate by some adhesive means such as wax and in such a manner that the orientation of the chips may be random. Although this method of transporting the chips may be satisfactory for some purposes, it does require that the chips be removed from the carrier plate, the mounting adhesive be cleaned off or otherwise removed, and the orientation of the chip be determined before the chip can be positioned in a circuit or otherwise tested. These various steps increase the potential for damaging the chips and the amount of service time required to identify damaged chips.

It is often desired that the chips be tested in some manner to determine circuit continuity and operation. The testing method may require 100 percent testing such as that demanded where circuits must function in a "no failure" manner. A second method of testing may be to test a certain number of the total number of chips and, if these pass, assume that the rest are serviceable. Present testing apparatus are limited in the temperature ranges in which the tests may be performed and satisfactory testing may not be feasible for depressed and elevated temperatures.

SUMMARY OF INVENTION

In view of the above, it is an object of this invention to provide a carrier device for the semiconductor beam lead chips which eliminates the need for applying an adhesive base to the chip for carrying or transporting and thereby reduces potential for damaging the chips.

It is a further object of this invention to provide a carrier device which allows orientation of the beam lead chip in a fixed orientation.

It is a further object of this invention to provide a carrier device which permits electrical testing at temperatures of from about −55°C to about +150°C of the beam lead chip without removing same from the carrier.

It is a further object of this invention to provide a carrier device that positions and retains the beam lead semiconductor chip in position for testing at temperature ranges of from about −55°C to about +150°C and is not affected by these temperatures.

Various other objects and advantages will appear from the following description of the invention and the most novel features will be pointed out hereinafter in connection with the appended claims. It will be understood that various changes in the details and structure of the embodiment herein described in order to explain the nature of the invention may be made by those skilled in the art without departing from the principles and scope of this invention.

The invention comprises a chip carrying device having a support base which has an open ended passageway or aperture extending therethrough, electrically conductive lead on the carrier support base or substrate oriented such that a portion of each conductive lead extends near to one end of the open-ended passageway; a carrier cover having a recessed portion which extends over the open ended passageway of the carrier base, and walls adjacent the recessed portion for maintaining electrical contact by compression between the beam leads of a chip and the electrically conductive leads on the carrier substrate, together with means for aligning the carrier cover on the carrier substrate and means for retaining the carrier cover in a biased mode against the carrier substrate.

DETAILED DESCRIPTION

Figure 1:
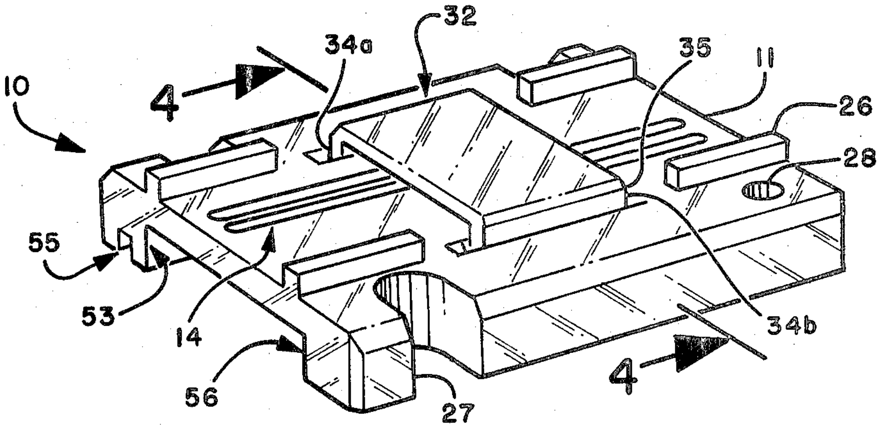
FIG. 1 is an enlarged view, in perspective, of a preferred embodiment of this invention for association with a chip having four beam leads.
Figure 3:
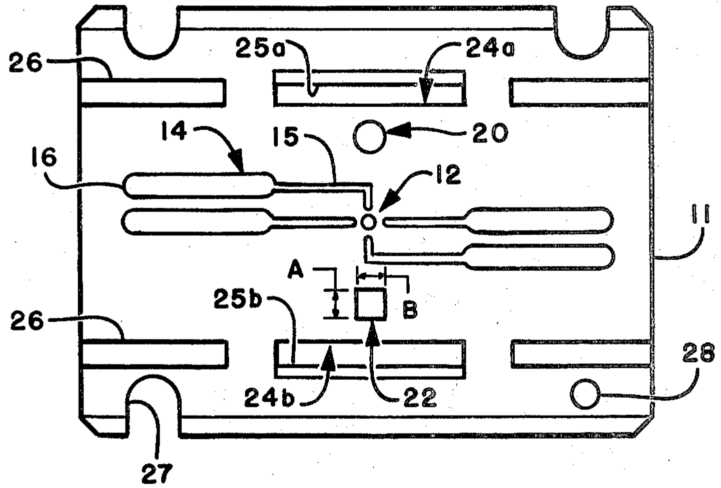
FIG. 3 is an enlarged elevational view of a carrier substrate embodiment.
Figure 4:
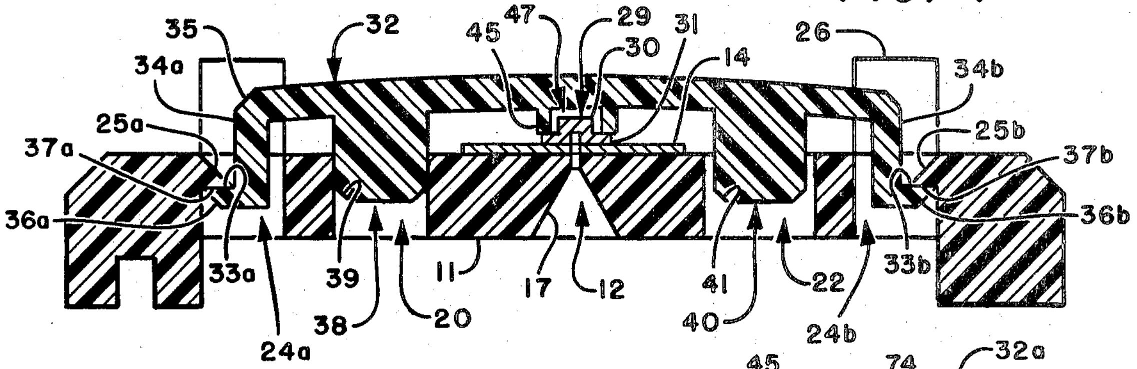
FIG. 4 is a cross section along lines 4—4 of FIG. 1.

As shown in FIGS. 1, 3 and 4, the carrier device 10 includes a generally planar carrier base or substrate 11 having certain cutout portions, grooves, raised portions and the like including a generally centrally located open ended aperture or passageway 12 extending therethrough. A plurality of electrically conductive leads or paths 14 on substrate 11 extend to a location adjacent one end of the open ended passageway 12 on a surface of substrate 11 and arranged to correspond with the beam leads of chips to be carried and tested.

Leads 14 may be made integral with or otherwise disposed on substrate 11 surface through methods well known in the art. For example, a conductor substrate of nickel-chromium may be deposited by vacuum deposition or sputtering techniques directly on substrate 11 and a gold coating may be subsequently deposited on the nickel-chromium layer using the same techniques. The leads 14 may likewise be deposited upon a suitable film which may subsequently be bonded to the substrate 11. The number and arrangement of leads 14 will be dependent upon the number and orientation of the beam leads in the beam lead chip or device which is to be carried or transported by carrier device 10.

As is shown in FIG. 3, the electrically conductive leads 14 may have a narrow portion 15 extending near the open ended passageway 12 and a wider portion 16 removed therefrom so as to facilitate making electrical contact onto leads 14 and testing of the chips transported by this device. The opposite end of open ended passageway 12 may have a flared or widened cone shaped portion 17 which facilitates placement of a vacuum probe over aperture or passageway 12 to retain the chip in position as will be described hereinafter. The substrate 11 may also include a first aligning port 20, a second aligning port 22, and locking slots or apertures 24*a* and 24*b* which co-operate with the carrier cover as will be described hereinbelow to align the carrier cover with respect to the orientation of the electrical conductive leads and to lock the beam lead chip in a compressed mode while the cover also remains in compression. Thus when placed on the carrier base 11, the cover urges the beam leads into electrical contact with electrically conductive paths or leads 14.

Locking slots 24*a* and 24*b* may contain a sloping or faceted portion 25*a*, 25*b* which facilitates the entrance of locking tabs as will be described hereinbelow. The substrate 11 may also contain a plurality of protruding walls 26, recesses 27, ports 28, and the like which may be used to carry, align, or lock the substrate 11 in automatic carrying equipment or the like, as well as to facilitate stacking and to safeguard to prevent incorrect alignment in the test setup.

Figure 2:
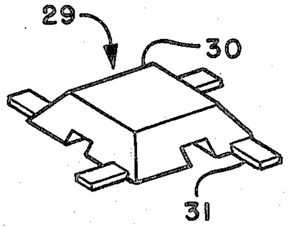
FIG. 2 is a greatly enlarged perspective view of a semiconductor beam lead chip suitable for use in the embodiment of FIG. 1.

FIG. 2 illustrates a beam leaded chip 29 which may typically comprise a body 30 and a plurality of outwardly extending or protruding beam leads 31. Chip 29 may be retained in position as described hereinbelow.

The carrier cover 32, as shown in FIGS. 1 and 4, may contain on an upper portion thereof surrounding or around the periphery of the cover a sloping or inclined portion 35 to facilitate handling and molding of the cover 32. Carrier cover 32 has releasable interlocking means such as outwardly extending or protruding flanges or locking tabs 33*a* and 33*b* which project outwardly from downwardly extending wall portions 34*a*, 34*b* along two sides or edges of cover 32 and co-operate with locking slots or apertures 24*a*, 24*b* to retain the carrier cover in position. One skilled in the art will readily recognize that although locking tabs are described, various other arrangements may serve the same purpose. The locking tabs or flanges 33*a* and 33*b* may contain an outside sloping portion or wall 36*a* and 36*b* which cooperates with the sloping portions 25*a* and 25*b* respectively to guide the locking tabs into locking slots or apertures 24*a* and 24*b*. As the locking tabs slip past undercut portions 37*a*, 37 *b*, the tabs flare out or expand and lock or engage cover 32 with substrate 11.

Cover 32 may further contain an aligning pin 38 or the like which co-operates and is engageable with first aligning port 20 of substrate 11. Aligning pin 38 may have a guide sloping or faceted portion 39 for facilitating entry of pin 38 into first aligning port 20. Port 20 may have a generally circular or arcuate shape shown corresponding with that of pin 38 to receive aligning pin 38, and the clearance between aligning pin 38 and port 20 may be maintained as a slip fit having from about 0 to about 0.001 inch clearance so as to obtain alignment or registry of the cover with the beam lead device and substrate 11. Second aligning port 22 co-operates and is engageable with second aligning pin 40 which likewise contains a guide sloping or faceted portion 41 for facilitating entry of second aligning pin 40 into second aligning port 22. Aligning port 22 may be of a rectangular, oblong, or the like configuration although second aligning pin 40 may be of generally cylindrical or other suitable configuration.

It may be desirable that there be a slack or loose fit between second aligning pin 40 and second aligning port 22 in the direction indicated by arrow A in FIG. 3 and this slack may be maintained at from about 0.002 inch to about 0.004 inch per side. This facilitates snapping on of cover 32 onto carrier substrate 11 without dimensional or other problems arising from such as covers 32 being slightly out of shape. Further, this dimension permits cover 32 to be deformed or "give" slightly when locking covers 32 into position. The dimension in the direction of arrow B, FIG. 3, may be maintained as for port 20, i.e., with a clearance of from 0 to about 0.001 inch. Carrier cover 32 may contain on its underside a protruding annular wall 45 which forms a chamber or recess 47 designed to accommodate the chip device without the chip touching any portion of cover 32. The wall 45 rests under compression or in a compressed mode upon the beam leads of the chip which is to be retained in place thereby insuring electrical contact between the beam leads 31 and electrically conductive paths 14.

FIG. 1 illustrates an assembled cover 32 and substrate 11 of this invention which is adapted to carry a four beam lead device. FIG. 4, which is a cross section along line 4—4 of FIG. 1, better illustrate how, in a preferred embodiment, the cover 32 co-operates with the carrier substrate 11 to maintain alignment and electrical contact between the beam leads of the chip and the electrical leads integrated into or formed on generally planar surface of substrate 11. The beam lead chip carrier substrate 11 may contain a pair of legs or downwardly extending walls 53 and 56. As shown, in FIG. 1, a wall 53 may include an elongated slot 55 which may be used in the same manner as downwardly extending walls 53 and 56, i.e., for automatic processing purposes such as alignment, movement, and retention as well as orientation in test fixtures.

The dimensions of the chips 29 and beam leads 31 may vary but typical dimensions are about 0.017 inch square for the body and about 0.004 inch long by about 0.002 inch wide for the beam leads 31. Semiconductor chip body 29 is disposed, located or positioned in recess 47 such as not to touch any portion of cover 32 other than contact between wall 45 and beam leads 31 as described hereinabove. Beam leads 31 are in contact with the narrow portion 15 of leads 14.

To place the beam lead chips on the carrier device 10, the chips may be disposed on a glass plate with the beam leads having the same orientation. The substrates 11 may be fed onto a belt or track in orderly arrangement by using such as a vibratory bowl feeder or tumbler. In operation, a first vacuum probe mounted on a swivable arm may be positioned over a beam lead device of known orientation and, using this vacuum probe, the beam lead device 29 may be picked up and positioned on a substrate 11 over open ended passageway 12 with appropriate beam leads 31 over and in contact with corresponding electrical leads 14 on substrate 11. Another vacuum probe of the type known in the art may be positioned at an opposite end of open ended passageway 12 over flared portion 17 to hold the semiconductor chip 29 in position while the first vacuum probe is removed and an additional vacuum probe positions the carrier cover 32 onto substrate 11 using aligning port 20 and aligning pin 38 together with second aligning port 22 and second aligning pin 40. Pressure is supplied by suitable means such as pneumatic means engaged to fingers disposed upon carrier cover 32 to insert protruding flanges or locking tabs 33*a* and 33*b* into their counterpart locking slots or locking apertures 24*a* and 24*b*. Locking tabs 33*a* and 33*b* are pushed through appropriate slots until the tab portion slips under undercut portions 37*a*, 37*b* of the slot or aperture 24*a*, 24*b*.

Mating of the tab with the undercut portion using appropriately dimensioned side walls 34*a*, 34*b* and locking tabs 33*a*, 33*b* proportionately sized to provide compression as illustrated in the drawings and described hereinabove retains a compressive bias upon covers 32 such that the wall portion 45 urges or otherwise maintains a compressive force against the beam leads 62 and narrow portion 15 of electrical conductor lead 14 to effect electrical contact.

The carrier device as loaded may be safely transported without damage to the chip. If desired to test prior to use, the device 29 may be tested by placing the carrier 10 in an appropriate test fixture and contacting the electrical conductors 14 with appropriate test apparatus. After testing, the carrier cover 32 is removed by inwardly compressing the protruding flanges or locking tabs 33*a* and 33*b* and applying an upward force upon cover 32 while retaining substrate 11 in a fixed position. The upward force may be provided by use of such as a vacuum probe. Another vacuum probe may be positioned before the cover removal over the open end of open ended passageway 12 to retain the chip in a fixed position. When desired, a further vacuum probe may be positioned over the chip to transport the chip to its desired position in an integrated circuit.

Figure 5:
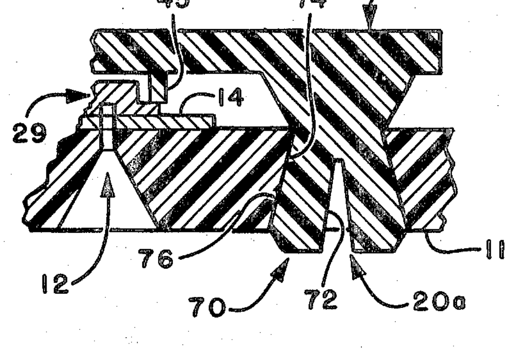
FIG. 5 is a fragmentary cross sectional view of an alternate locking means.

FIG. 5 illustrates, in a fragmentary cross sectional view, an alternate method that may be employed for aligning and locking of cover 32*a* with respect to a desired orientation of lead beam device 29 on substrate 11. As shown, locking split pin 70 is inserted into the port or opening formed by wall 74 forming a port 20*a* on substrate 11. The outer wall 76 of locking split pin 70 conforms to geometry of wall 74. Pin 70 contains a split, channel, or separated portion 72 which permits insertion of pin 70 into the port 20*a* formed by wall 74 on substrate 11 and subsequent positioning or locking upon expansion of pin 70 so as to effectively maintain compressive contact by wall 45 of beam lead 31 and electrical conductor 14 as well as alignment of the beam leads with respect to the electrical conductors or paths on substrate 11.

The beam lead chip carrier device described herein provides safe transportation of chips without having to apply any type of adhesive material which must be removed at a later time and at the same time providing an apparatus or device which lends itself to electronic testing of the chip. The material used for the carrier cover and the carrier substrate may be any suitable material which is sufficiently rigid and which may not be affected by the temperatures required for testing. Polysulfone material has been successfully used for this camera device 10. It may be desirable to use clear or transparent polysulfone which further facilitates knowing whether the carrier device is loaded or not. Devices made of polysulfone material have been tested at low temperatures such as about −55°C and at elevated temperatures such as at about +150°C without adverse effects.

The carrier chip combination described herein permits the "burn-in" test which is highly desirable for this type of semiconductor device. These tests have been made upon devices of this invention by applying full power to the chips continuously for a period of about 168 hours while the chip is at about 150°C. Chips tested by this device have been successfully put into service and the carrier device of this invention has been reused without any harmful effects upon the substrate or cover.

Although a device suitable for use with a four beam lead semiconductor chip has been illustrated and described, one skilled in the art will know that the number of beam leads or electrical conductors is not limited to four but may be less or more depending upon the requirements. Thus devices which will accept beam lead semiconductor chips having eight, 12, 20, etc., beam leads have been used. The dimensions of the carrier may be enlarged to accept a higher number of leads. For example, a four or eight beam lead semiconductor chip carrier may measure approximately 1 inch long by three quarters of an inch wide whereas a carrier for a semiconductor chip having 20 beam leads may measure 2 inches long by 2 inches wide.

What is claimed is:

1. A carrier for a microcircuit chip having beam leads to facilitate handling and testing operations, comprising a substrate having a surface with a plurality of electrically conductive paths thereon and an aperture extending through the substrate from said surface, each of said paths having an end adjacent said aperture; a cover having a projection for contacting a portion of a said chip to maintain the chip in registry with said aperture and for retaining said chip beam leads in electrical contact with said substrate electrically conductive paths; means for aligning said cover with said substrate and said chip beam leads in registry with said substrate electrical paths; and interlocking means for releasably holding said cover and said substrate together and urging one toward the other.

2. The carrier of claim 1 wherein said aligning means comprises a plurality of protrusions carried by said cover and said substrate has ports for receiving and guiding said protrusions.

3. The carrier of claim 2 wherein said interlocking means comprises locking tab portions carried by said cover which coact with locking slots on said substrate to releasably hold said cover on said substrate.

4. The carrier of claim 3 wherein said projection on said cover comprises a protruding wall forming a recess for housing said chip.

* * * * *